(12) United States Patent
Hiroki

(10) Patent No.: US 7,572,742 B2
(45) Date of Patent: Aug. 11, 2009

(54) EQUIPMENT AND METHOD FOR PROCESSING SEMICONDUCTOR

(75) Inventor: Tsutomu Hiroki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/592,503

(22) PCT Filed: Feb. 24, 2005

(86) PCT No.: PCT/JP2005/003035

§ 371 (c)(1),
(2), (4) Date: Sep. 12, 2006

(87) PCT Pub. No.: WO2005/098934

PCT Pub. Date: Oct. 20, 2005

(65) Prior Publication Data

US 2007/0275486 A1    Nov. 29, 2007

(30) Foreign Application Priority Data

Mar. 30, 2004    (JP)    ............................. 2004-100270

(51) Int. Cl.
*H01L 21/00* (2006.01)
*B66C 23/00* (2006.01)
(52) U.S. Cl. .................................. 438/800; 414/744.5
(58) Field of Classification Search ................. 438/800; 414/744.5
See application file for complete search history.

(56) References Cited

U.S. PATENT DOCUMENTS

| | | | |
|---|---|---|---|
| 5,934,856 A | * | 8/1999 | Asakawa et al. ............ 414/217 |
| 2005/0095111 A1 | * | 5/2005 | Kim et al. ................ 414/744.5 |

FOREIGN PATENT DOCUMENTS

| | | |
|---|---|---|
| JP | 6 210066 | 8/1994 |
| JP | 10 233426 | 9/1998 |
| JP | 11 163083 | 6/1999 |
| JP | 411163083 A * | 6/1999 |
| JP | 11 330204 | 11/1999 |
| JP | 2001 15575 | 1/2001 |
| JP | 2002 222844 | 8/2002 |

* cited by examiner

*Primary Examiner*—W. David Coleman
(74) *Attorney, Agent, or Firm*—Oblon, Spivak, McClelland, Maier & Neustadt, P.C.

(57) ABSTRACT

Semiconductor processing equipment includes a transfer chamber (3) having a plurality of transfer ports (33) arranged at different positions in a lateral direction. A process chamber (4A) for performing a semiconductor process to a substrate (W) to be processed is connected with the transfer chamber (3) through one of the transfer ports. A transfer arm device (5) is arranged in the transfer chamber (3) so as to transfer the substrate (W) through a plurality of the transfer ports (33). A drive mechanism (55) is arranged so as to extend and retract the transfer arm device (5) and to turn it in a vertical axis direction. Inclination adjusting mechanisms (6A-6C) are arranged so as to adjust the inclination of the transfer arm device (5).

19 Claims, 10 Drawing Sheets

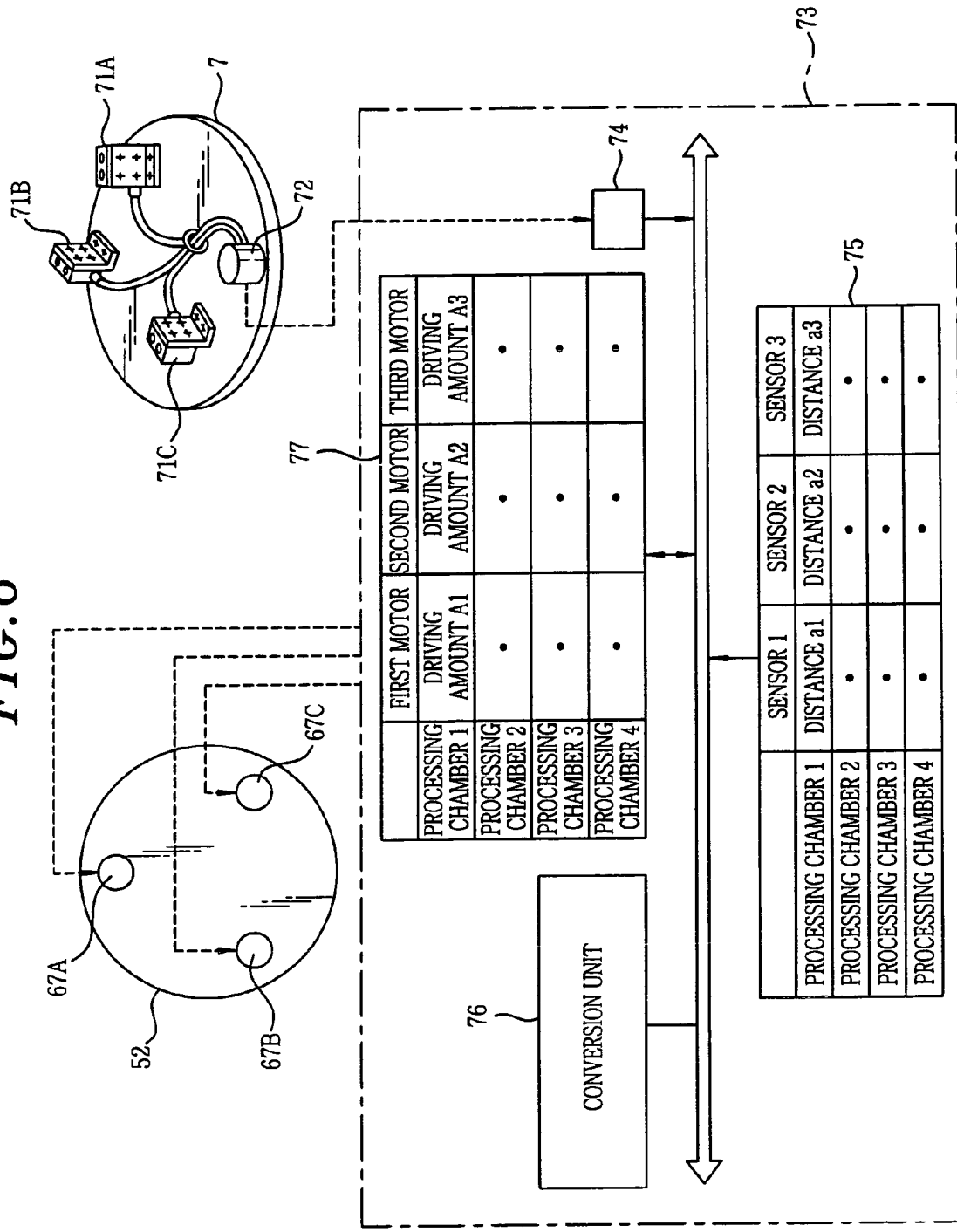

EQUIPMENT AND METHOD FOR PROCESSING SEMICONDUCTOR

FIELD OF THE INVENTION

The present invention relates to a semiconductor processing equipment having a mechanism for adjusting an inclination of a transfer arm device and a semiconductor processing method using the same. The term "semiconductor processing" used herein denotes various processes required to manufacture a semiconductor device or a structure, which includes wiring, electrode and the like connected to the semiconductor device, on a substrate to be processed by forming a semiconductor layer, an insulating layer, a conductive layer and the like in a predetermined pattern on the substrate to be processed, e.g., a semiconductor wafer or a glass substrate for an LCD (Liquid Crystal Display) or an FPD (Flat Panel Display).

BACKGROUND OF THE INVENTION

In order to manufacture a semiconductor device, various processes such as a film forming process, an etching process, an oxidation process, a diffusion process, an annealing process, a quality modification process and the like are performed on a semiconductor wafer, which is a substrate to be processed. In these processes, it is required to improve a throughput and a production yield, along with microminiaturization and high-integration of a semiconductor device. In view of the above, there is known a so-called multi-chamber type (cluster tool type) semiconductor processing equipment capable of performing various processes successively without exposing a wafer to the atmosphere by combining a plurality of process chambers for performing same or different type processes via a common transfer chamber. Such type of semiconductor processing equipment is disclosed in, e.g., Japanese Patent Laid-open Application No. 2000-127069 (see FIG. 1 thereof), and the like.

FIG. 12 is a schematic plan view of a conventional multi-chamber type semiconductor processing equipment. As shown in FIG. 12, the processing equipment has an atmospheric transfer chamber 10 arranged in parallel with a cassette stage 1. Further, a multi-joint transfer arm device 11 capable of extending, retracting and turning is provided in the atmospheric transfer chamber 10. A hexagonal vacuum transfer chamber 14 is connected with the atmospheric transfer chamber 10 via two load-lock chambers 12. A multi-joint transfer arm device 13 capable of extending, retracting and turning is disposed in the transfer chamber 14. Four vacuum process chambers 15 (for performing a film forming process or an etching process, for example) are connected with the transfer chamber 14. Furthermore, the process chambers 15 are connected with each other via gate valves 16.

In order to perform the processing, a rack-type cassette container 20 accommodating therein, e.g., 25 sheets of wafers W, is mounted on the cassette stage 1. Next, one of the wafers W is transferred from the cassette container 20 to one of the load-lock chambers 12 by the transfer arm device 11. Then, the wafer W is transferred from the load-lock chamber 12 to the transfer chamber 14 by the transfer arm device 13. Thereafter, the wafer W is loaded into an empty process chamber 15 and then subjected to, e.g., an etching process. In case the wafer W is loaded into the process chamber 15, first of all, the wafer W is delivered from the transfer arm device 13 onto three lifter pins (not shown) which will be lowered so that the wafer will be mounted on a mounting table 15a.

After setting an imaginary reference surface in the entire apparatus, it is checked whether or not a transfer surface of the wafer W supported by the transfer arm device 13, i.e., a backside of the wafer W, is aligned with respect to the imaginary reference surface. In order to accurately exchange the wafer W, the transfer surface needs to be within ±0.3 mm from the imaginary reference surface throughout the entire access area. Such accuracy is needed because, in recent times, each of the transfer ports of the gate valves 16 is formed to have a narrow width, for improving plasma uniformity by improving symmetry in the process chambers and also for scaling down opening/closing units of the gate valves 16. Further, if the backside of the wafer W is tilted with respect to the imaginary reference surface, when the wafer W is delivered onto the lifter pins, the three lifter pins are not simultaneously contacted with the backside of the wafer W, thereby resulting in an unstable exchange of the wafer W.

SUMMARY OF THE INVENTION

It is, therefore, an object of the present invention to provide a semiconductor processing equipment capable of transferring a substrate to be processed with high horizontal stability and a semiconductor processing method using the same.

In accordance with one aspect of the invention, there is provided a semiconductor processing equipment including:

a transfer chamber having a plurality of transfer ports disposed at different positions in a lateral direction;

a process chamber connected to the transfer chamber via one of the plurality transfer ports, for performing a semiconductor processing on a substrate to be processed;

a transfer arm device arranged in the transfer chamber, for transferring the substrate to be processed via the plurality of transfer ports;

a drive mechanism for extending and retracting the transfer arm device and turning the transfer arm device around a vertical axis direction; and an inclination adjusting mechanism for adjusting an inclination of the transfer arm device.

In accordance with another aspect of the invention, there is provided a semiconductor processing method using the semiconductor processing equipment disclosed in claim 1, the method including the steps of:

detecting data on an inclination of the transfer arm device by using a detector;

adjusting an inclination of the transfer arm device based on the data by using the inclination adjusting mechanism;

loading the substrate to be processed into the process chamber by using the transfer arm device having the adjusted inclination; and performing a semiconductor processing on the substrate to be processed in the process chamber.

BRIEF DESCRIPTION OF THE DRAWINGS

FIG. 6 offers an explanatory diagram depicting a control unit for adjusting an inclination of the transfer arm device in the equipment of FIG. 1.

DETAILED DESCRIPTION OF THE PREFERRED EMBODIMENTS

Figure 1:
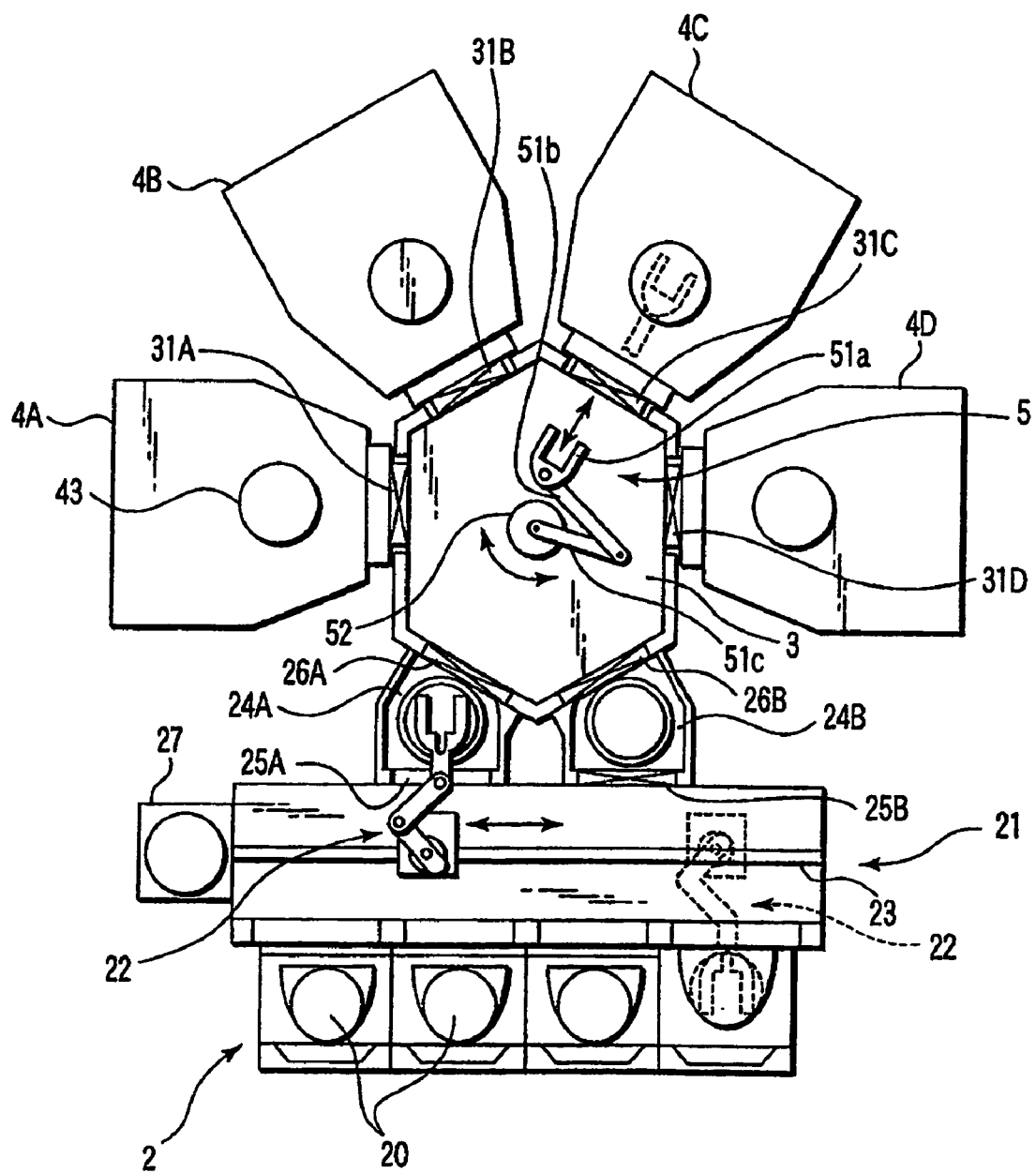
FIG. 1 is a schematic top view of a semiconductor processing equipment in accordance with a preferred embodiment of the present invention.

The present inventor has studied a transfer misalignment of conventional semiconductor processing equipments while developing the present invention and reached to a conclusion to be described hereinafter.

Recently, along with a trend for a scaling up of a wafer W, the transfer arm device 13 is extended, accordingly, so that an access area thereof becomes enlarged. As a result, it becomes difficult to ensure transfer accuracy with respect to an imaginary reference surface throughout the entire access area. Especially, in case the transfer arm device 13 for supporting the wafer W is extended, it is difficult to ensure the transfer accuracy.

In order to align the backside of the wafer W with the imaginary reference surface, there can be provided a mechanism for adjusting a height of the transfer arm device 13 (Z-axis adjusting mechanism). However, if the Z-axis is tilted by any reason whatsoever, the wafer W is tilted with respect to the imaginary reference surface, which hinders the height adjustment. Such phenomenon occurs because a bottom portion of the transfer chamber 14, where the transfer arm device 13 is disposed, becomes uneven due to a deformation caused by a stress generated by a vacuum exhaust, a limitation of manufacturing precision or the like, for example.

Besides, there is considered a configuration, wherein the number of process chambers 15 connected with the transfer chamber 14 increases and the transfer arm device 13 accesses each of a plurality of process chambers 15 in a lateral sliding motion. In accordance with such configuration, it is possible to improve a processing efficiency or carry out a batch production, for example. In this case, however, the access area of the transfer arm device 13 becomes enlarged further more, so that the effect of the unevenness of the bottom portion of the transfer chamber 14 increases. Moreover, if an area of the bottom portion of the transfer chamber 14 is enlarged, the force applied thereto during the vacuum exhaust increases and, thus, the unevenness of the bottom portion cannot be suppressed. Hence, it is more difficult to ensure the transfer accuracy.

Hereinafter, preferred embodiments of the present invention will be described with reference to the accompanying drawings. Further, like reference numerals will be given to like parts having substantially same functions, and a redundant description thereof will be omitted unless it is necessary.

Figure 2:
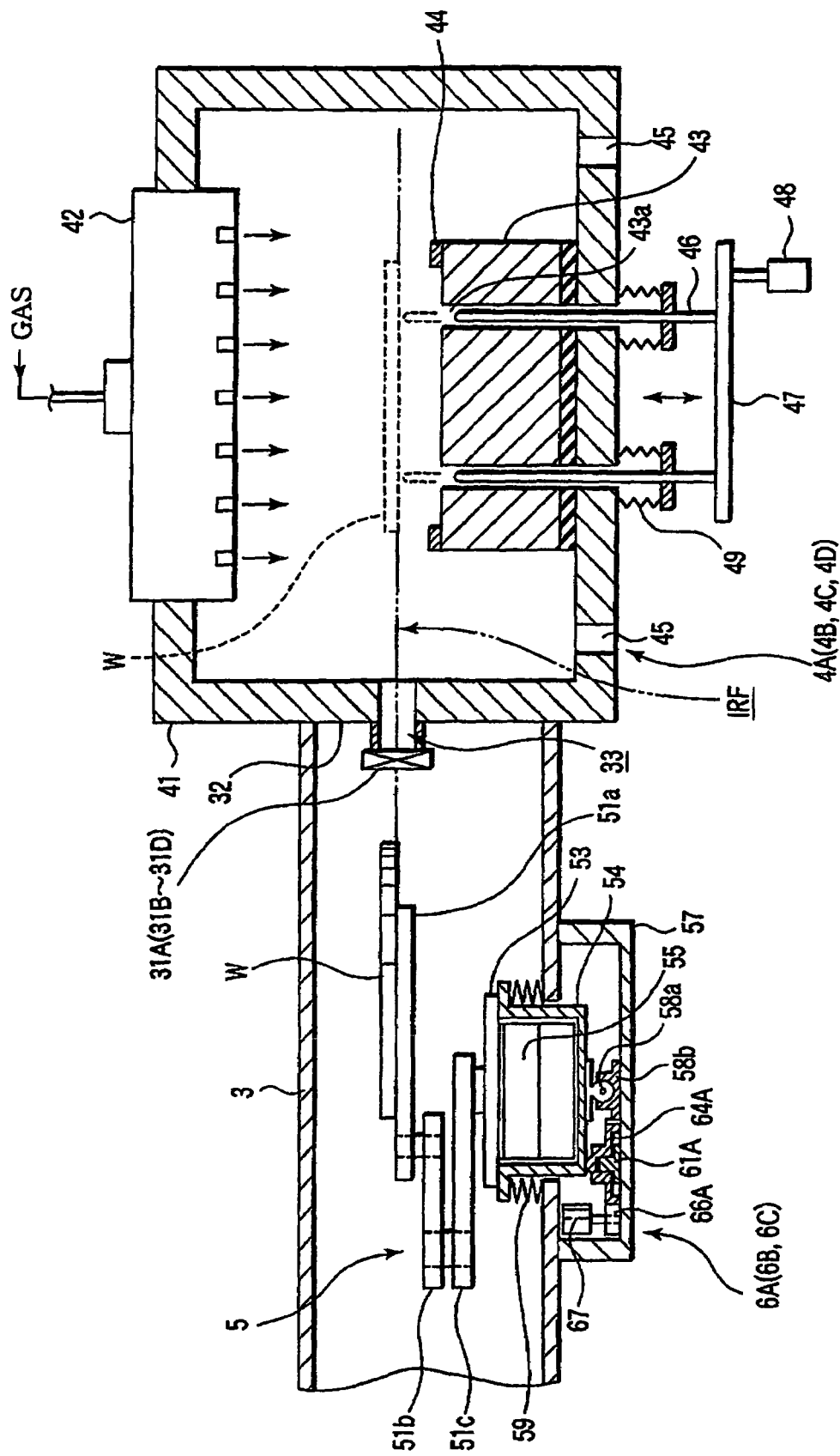
FIG. 2 shows a vertical sectional view of a vacuum transfer chamber and a vacuum process chamber of the equipment of FIG. 1.

FIG. 1 is a schematic top view of a semiconductor processing equipment in accordance with a preferred embodiment of the present invention. FIG. 2 shows a vertical sectional view of a vacuum transfer chamber and a vacuum process chamber of the equipment of FIG. 1. As shown in FIG. 1, the processing equipment has a cassette stage 2 capable of mounting thereon a plurality of rack-type cassette containers 20, each accommodating therein, e.g., 25 sheets of semiconductor wafers W as substrates to be processed. Further, a transfer stage 21 is adjacently arranged on one side surface of the cassette stage 2 along a longitudinal direction thereof. Moreover, a multi-joint transfer arm device 22 capable of extending, retracting and turning is provided on the transfer stage 21 to exchange the wafers W. Since the transfer arm device 22 is arranged such that it can slide along a guide rail 23, it can access the wafers W in any of the cassette containers 20.

Load-lock chambers 24A and 24B serving as preliminary vacuum chambers, each having a mounting portion for mounting thereon the wafers W, are connected to a rear portion of the transfer stage 21 via gate valves 25A and 25B, respectively. Further, a vacuum transfer chamber 3 capable of exhausting an inner space thereof to vacuum is connected to rear portions of the load-lock chambers 24A and 24B via gate valves 26A and 26B, respectively. The transfer chamber 3 is formed in a polygonal shape, e.g., a hexagonal shape, seen from above. Moreover, a plurality of transfer ports 33 is arranged on six side surfaces of the transfer chamber 3. In other words, the transfer chamber 3 has the plurality of transfer ports 33 arranged at different positions in a lateral direction.

The transfer ports 33 provided on two side surfaces of the transfer chamber 3 are connected with the load-lock chambers 24A and 24B via the gate valves 26A and 26B, respectively. Further, the transfer ports 33 disposed on the other four side surfaces of the transfer chamber 3 are airtightly connected with, e.g., four vacuum process chambers 4A, 4B, 4C and 4D, via gate valves 31A, 31B, 31C and 31D, respectively. The transfer chamber 3 can be formed in a circular shape or an elliptic shape, for example, as long as it can be radially connected with the process chambers 4A~4D. An orienter 27 serving as a device for positioning the wafer W is connected to one end of the transfer stage 21. The orienter 27 optically monitors a peripheral portion of the wafer W where notches or the like are formed while rotating the wafer W, thereby detecting an eccentric amount, an eccentric direction and an orientation of the wafer W.

The process chambers 4A~4D are set to perform same or different type processes among various processes such as a film forming process, a diffusion process, an etching process and the like. For example, in a process chamber for performing the etching process, a silicon oxide film or a silicon nitride film can be etched by using a CF-based processing gas. Or, a tungsten silicide film or a polycrystalline silicon film can be etched by using a single gas such as Cl-based gas, HBr-based gas, SF-based gas, $O_2$ gas, He gas and the like or by using a mixture of these gases.

For instance, in case the same type processes are performed on the plurality of wafers W in parallel, same type process chambers are selected. On the other hand, in case a series of different type processes are performed on the single wafer W, for example, in case the silicon oxide film is etched and, then, the tungsten silicide film is etched, different type process chambers are selected. FIG. 2 illustrates an example of the process chambers 4A~4D, i.e., an etching process chamber for etching the wafer W under a vacuum atmosphere by using plasma.

The etching process chamber 4A (4B~4D) has an airtight vessel 41 for forming a vacuum state. Further, a gas shower head 42 serving as an upper electrode is disposed on a ceiling portion of the airtight vessel 41. Accordingly, a processing gas containing, e.g., halocarbon gas, $O_2$ gas, Ar gas and the like, is supplied through the gas shower head 42 to the airtight vessel 41. Moreover, a gas exhaust port 45 for exhausting the processing gas is formed on a bottom portion of the airtight vessel 41.

A mounting table 43 for mounting thereon the wafer W and also serving as a lower electrode is installed in the airtight vessel 41 such that it faces the gas shower head 42. Further, a focus ring 44 is provided on the mounting table 43 to surround an outer periphery of the wafer W with a gap therebetween. Moreover, an RF power supply (not shown) for applying a high frequency electric field for generating plasma is connected with the upper electrode (the gas shower head 42). Furthermore, an RF power supply (not shown) for applying a bias voltage is connected with the lower electrode (the mounting table 43).

Vertically extending through holes 43a are formed through a surface of the mounting table 43. Further, three lifter pins 46 for supporting the backside of the wafer W are disposed such that they can be protruded and depressed through the through holes 43a. Each of the lifter pins 46 is connected with a common supporting plate 47 and can move vertically by a driver 48 connected to the supporting plate 47. Moreover, bellows 49 for maintaining an airtight state are provided at portions where the lifter pins 46 penetrate the airtight vessel 41.

Figure 3:
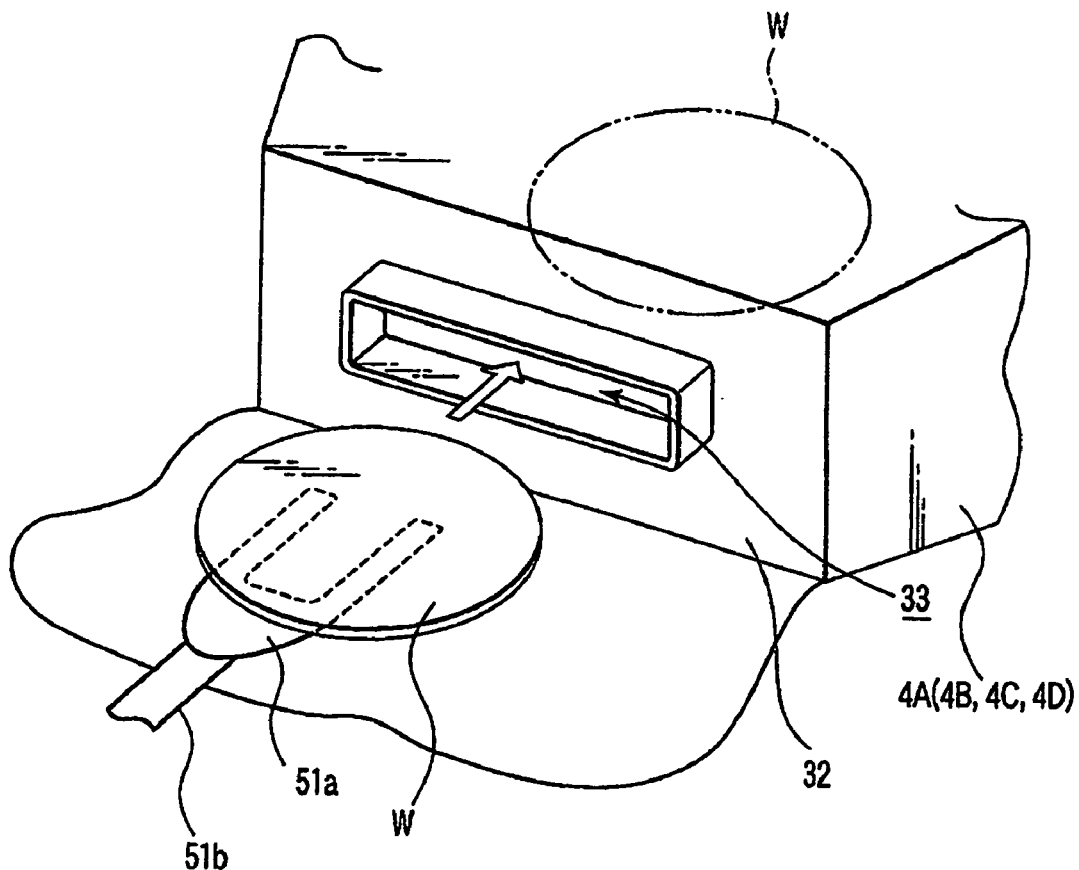
FIG. 3 describes a perspective view of a transfer port of the equipment of FIG. 1.

FIG. 3 describes a perspective view of a transfer port 33 of the equipment of FIG. 1. The transfer port 33 is formed on a partition wall 32 (wall surface of the airtight vessel 41) for partitioning the transfer chamber 3 and the process chambers 4A to 4D. The transfer port 33 has a horizontally extending strip shape and is surrounded by a frame protruded toward the transfer chamber 3. A gate valve 31A (31B~31D) is positioned such that it blocks the transfer port 33 (not shown in FIG. 3). When the gate valve 31A (31B~31D) is opened by an opening/closing mechanism (not shown), the wafer W can be exchanged between the transfer chamber 3 and the process chambers 4A~4D. The transfer port 33 is formed to have a small length and a narrow width in order to enhance the uniformity of the semiconductor processing by improving symmetry in the process chambers 4A~4D.

A multi-joint transfer arm device 5 capable of extending, retracting and turning is disposed on a bottom portion of the transfer chamber 3. Further, the transfer arm device 5 includes a hand 51a, e.g., for supporting the backside of the wafer W from underside, an intermediate arm 51b and a lower arm 51c. The lower arm 51c is supported at an upper plate 53 of a rocking table 52. Each of the joint arms 51a~51c has therein a transfer unit (not shown) for transferring a turning operation of a drive mechanism 55.

Figure 4A:
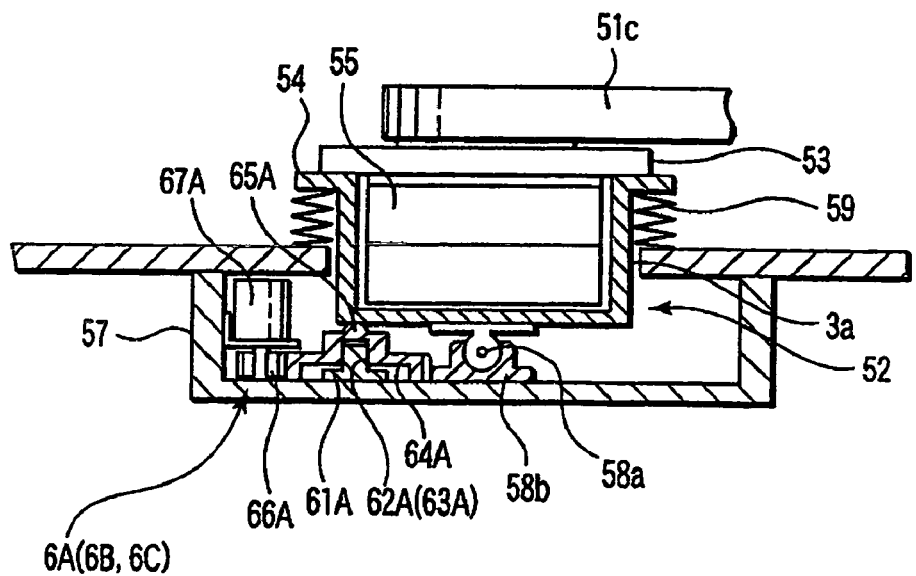
FIG. 4A depicts a sectional view of a rocking table for supporting a transfer arm device provided in the vacuum transfer chamber of the equipment of FIG. 1.
Figure 4B:
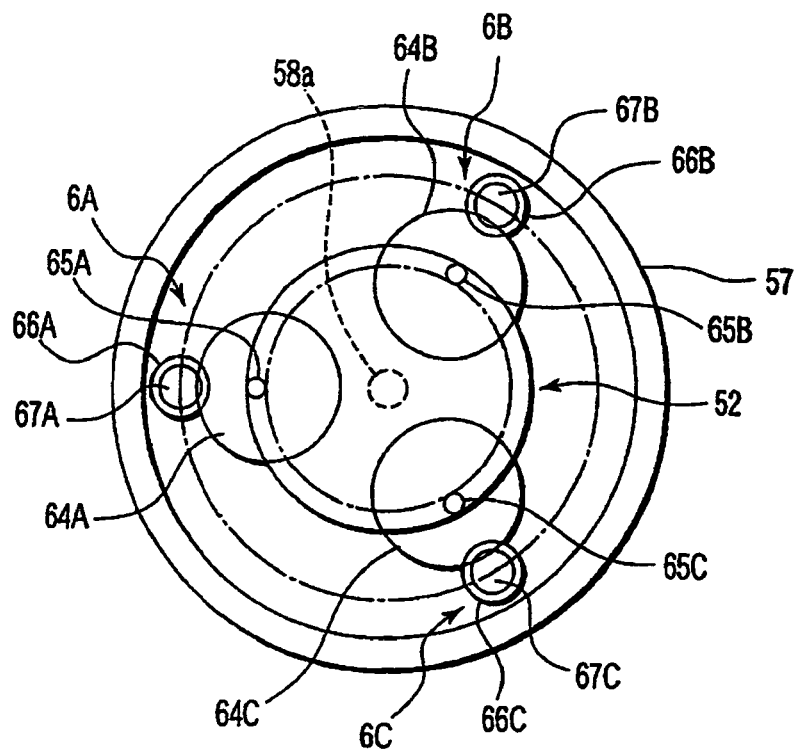
FIG. 4B presents a top view of the rocking table of FIG. 4A.

FIG. 4A depicts a sectional view of the rocking table 52 for supporting the transfer arm device 5 provided in the vacuum transfer chamber 3 of the equipment of FIG. 1. FIG. 4B presents a top view of the rocking table 52 of FIG. 4A. As shown in FIG. 4A, the rocking table 52 includes a cylindrical casing 54 having a bottom surface. In the casing 54, a drive mechanism 55, for extending and retracting the transfer arm device 5 and turning it around a vertical axis direction, is provided. To be specific, the drive mechanism 55 is formed of a motor for extending and retracting the transfer arm device 5, a motor for turning the entire transfer arm device 5 and the like. Accordingly, the transfer arm device 5 is able to extend, retract and turn while supporting the wafer W, for example.

The rocking table 52 is positioned such that it penetrates an opening 3a formed on the bottom portion of the transfer chamber 3. The opening 3a is closed from the underside by a downwardly protruded cover 57. Further, at a center of an outer bottom portion of the casing 54 of the rocking table 52, a spherical protrusion 58a protruded downwardly is provided. The spherical protrusion 58a is movably insertion-fitted to a support portion 58b provided on an inner surface of the cover 57, thereby forming a universal joint capable of tilting the rocking table 52 in any direction of 360°.

The casing 54 of the rocking table 52 is supported from the underside by, e.g., three, adjusters 6A, 6B and 6C disposed on the inner surface of the cover 57, each being separately movable in a vertical direction. The adjusters 6A, 6B and 6C are provided, e.g., on a same circle about the spherical protrusion 58a (see FIG. 4B). Further, the adjusters 6A~6C form an inclination adjusting mechanism (tilt adjusting mechanism) for adjusting an inclination of the transfer arm device 5 by adjusting an inclination of the rocking table 52. By adjusting the respective heights of the adjusters 6A, 6B and 6C, the inclination of the transfer arm device 5 and that of the rocking table 52 can be adjusted together in any direction of 360° around a center of the spherical protrusion 58a. The installation number of the adjusters 6A~6C can increase without being limited to three.

A bellows (pliable wall) 59 for maintaining an airtight state of the transfer chamber 3 is provided between an upper peripheral portion of the casing 54 of the rocking table 52 and the bottom portion of the transfer chamber 3. The bellows 59 separates a space, where the adjusters 6A~6C and the universal joints 58a and 58b are arranged, from an inner space of the transfer chamber 3. Further, the bellows 59 allows the rocking table 52 to move in any direction of 360 degrees.

As shown in FIG. 4A, each adjuster 6A (6B, 6C) have a guide 61A (61B, 61C), which is arranged in an inner surface of the cover 57 and extended upwardly. Moreover, a male screw 62A (62B, 62C) is formed on surfaces of the guide 61A (61B, 61C) and screwed with a female screw 63A (63B, 63C) formed on shaft holes of a first gear 64A (64B, 64C). In addition, a protrusion 65A (65B, 65C) for supporting the casing 54 from underside is formed on upper surfaces of the first gear 64A (64B, 64C).

A second gear 66A (66B, 66C) is provided to be screw-coupled to the first gear 64A (64B, 64C). Further, the second gear 66A (66B, 66C) is attached to a driving unit, e.g., a rotational shaft of a motor 67A (67B, 67C). If the second gear 66A (66B, 66C) rotates about a vertical axis by driving the motor 67A (67B, 67C), the first gear 64A (64B, 64C) also rotates about the vertical axis. If the first gear 64A (64B, 64C) rotates, the female screw 63A (63B, 63C) is engaged with the male screw 62A (62B, 62C) of the guide 61A (61B, 61C), thereby moving the first gear 64A (64B, 64C) in an axial direction (vertical direction). In other words, the protrusion 65A (65B, 65C) supporting the casing 54 is vertically moved by driving the motor 67A (67B, 67C).

In the semiconductor processing equipment shown in FIG. 1, in order to perform the processing, the rack-type cassette container 20 accommodating therein, e.g., 25 sheets of wafers W, is mounted on the cassette stage 2. Next, one of the wafers W is transferred from the cassette container 20 to the orienter 27 to be positioned by the transfer arm device 22. Then, the wafer W is transferred from the orienter 27 to an empty load-lock chamber 24A (24B) via the gate valve 25A or 25B by the transfer arm device 22.

After the load-lock chamber 24A (24B) is depressurized, the wafer W is transferred from the load-lock chamber 24A (24B) to the transfer chamber 3 by the transfer arm device 5. Next, the wafer W is loaded into an empty process chamber, e.g., 4A (4B, 4C, 4D) to be subjected to a specific processing. In case the wafer W is loaded into the process chamber 4A (4B, 4B, 4D), first of all, the wafer W is delivered from the transfer arm device 5 onto three lifter pins 46 (see FIG. 2), and then mounted on the mounting table 43 by lowering the lifter pins 46. After being subjected to the specific processing in the process chamber 4A (4B, 4C, 4D), the wafer W is returned to the cassette container 20 by reversely carrying out the aforementioned loading process.

Figure 5A:
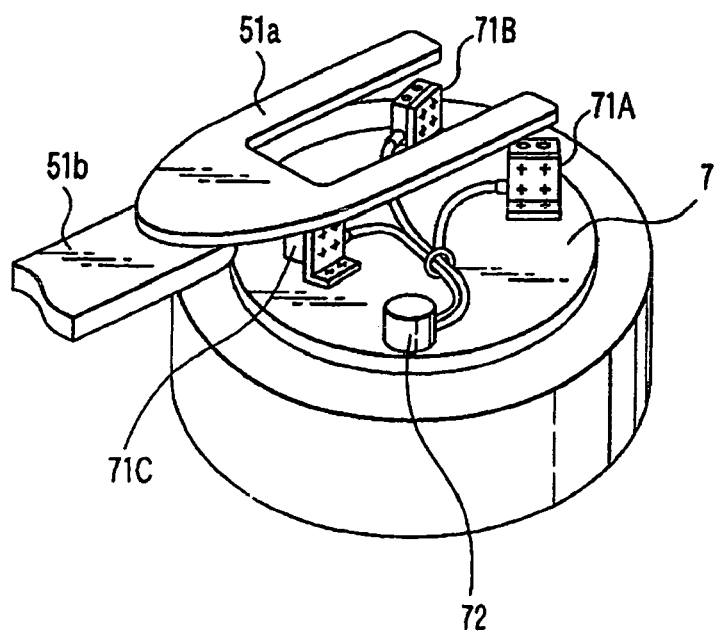
FIG. 5A represents a perspective view for illustrating how to detect an inclination of the transfer arm device of the equipment of FIG. 1.
Figure 5B:
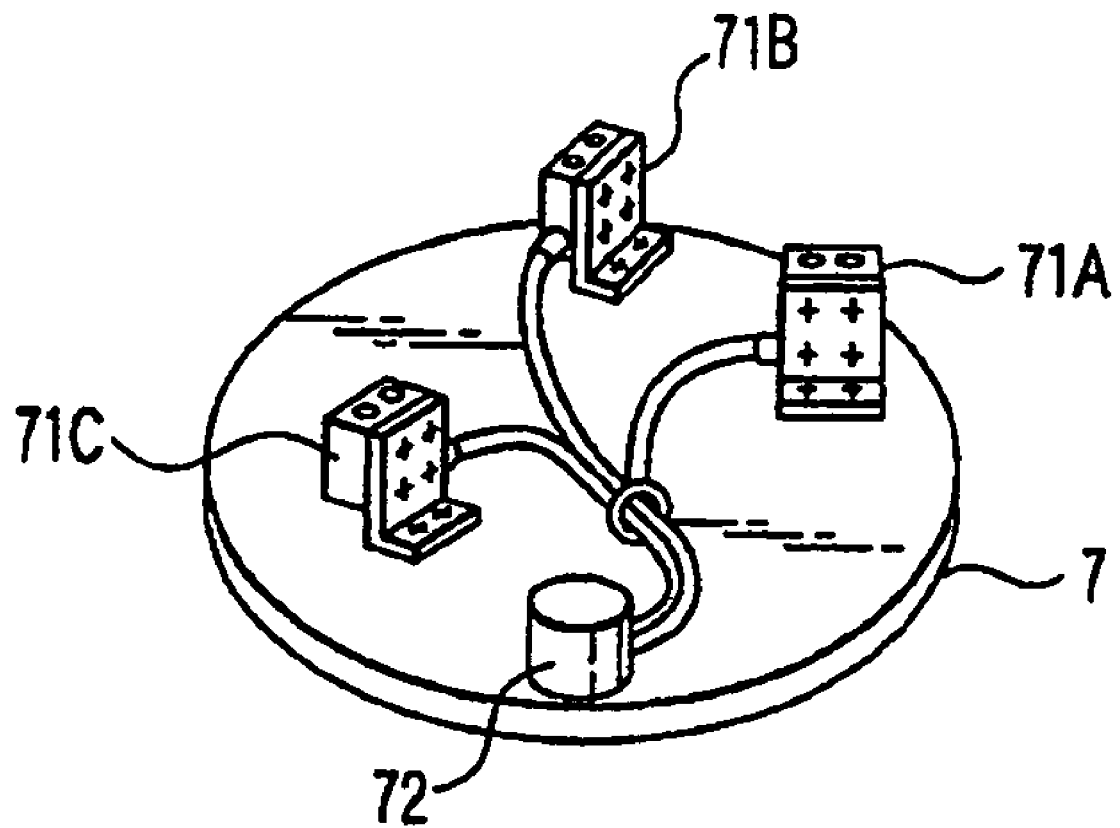
FIG. 5B provides a perspective view of a detector (dummy substrate) for detecting an inclination of the transfer arm device of FIG. 5A.

FIG. 5A represents a perspective view for illustrating how to detect an inclination of the transfer arm device 5 of the equipment of FIG. 1. FIG. 5B provides a perspective view of a detector (dummy substrate) 7 for detecting an inclination of the transfer arm device 5 of FIG. 5A.

The dummy substrate 7 is set to have the same diameter as that of the wafer W so that it can replace the wafer W. Three optical sensors (distance detectors) 71A, 71B and 71C spaced from each other, for example, are coaxially provided, e.g., on the dummy substrate 7 about a center of the dummy substrate 7, each having a light emitting unit and a light receiving unit. The dummy substrate 7 is mounted on the mounting table 43 in the process chamber 4A (4B, 4C, 4D), for example, and used while the transfer arm device 5 is extended thereabove. At this time, the optical sensors 71A~71C are positioned such that they face a fork-shaped leading end portion and a base portion of the hand 51a. The light emitting units of the optical sensors 71A~71C emit light toward the hand 51a, whereas the light receiving units thereof receive light reflected from a facing portion of the hand 51a.

Accordingly, a distance from each optical sensor 71A (71B, 71C) to the facing portion of the hand 51a is detected based on an intensity of the light reflected from the hand 51a. To be more specific, based on the detection result from the three optical sensors 71A~71C, it is possible to detect a tilting direction of the hand 51a with respect to a vertical axis and a tilting degree thereof with respect to a horizontal surface. Further, since a vertical distance from a surface of the mounting table 43 to the light receiving surfaces of the optical sensors 71A~71C can be obtained, a height difference between the imaginary reference surface IRF (see FIG. 2) and the backside of the wafer W can be calculated. Moreover, a communication unit 72 is provided on the dummy substrate 7 and wirelessly transmits, e.g., via infrared rays, the distance data (sensor data), i.e., the detection result from the optical sensors 71A~71C, to a control unit 73 to be described later. The sensor data are sequentially transmitted from the communication unit 72 to the control unit 73 at specific intervals.

FIG. 6 offers an explanatory diagram depicting the control unit 73 for adjusting an inclination of the transfer arm device 5 in the equipment of FIG. 1. The control unit 73 includes a computer system having a CPU, for example. To be more specific, the control unit 73 includes a communication unit 74 for receiving the detection result from the optical sensors 71A~71C and a storage unit 75 for storing therein the distance data (from the optical sensors 71A~71C to the hand 51a) for each process chamber 4A (4B, 4C, 4D).

The control unit 73 further includes a conversion unit 76 for obtaining driving instruction values (driving amount) of the three motors 67A~67C based on the three distance data detected by the optical sensors 71A~71C. The three distance data indicate, in case the height-direction distances between each of the light receiving surfaces of the optical sensors 71A~71C and the surface of the mounting table 43a are given, relative position of the hand 51a, i.e., a height difference and an inclination with respect to the imaginary reference surface IRF. Moreover, the driving instruction value indicates a driving amount required to fit the hand 51a to the imaginary reference surface IRF.

The conversion unit 76 can refer to a preset table in order to convert the distance data into a driving instruction value. The table contains a relationship between combinations of the three distance data and driving amounts (vertical movement amounts) of the first gears 64A~64C with respect to reference positions by the three motors 67A~67C. Further, the conversion process can be performed on the assumption that the height of the hand 51a hardly changes. In this case, a combination of differences in the distance data, e.g., a detection distance difference between the optical sensors 71A and 71B and that between the optical sensors 71A and 71C, can be converted into driving instruction values.

Figure 7:
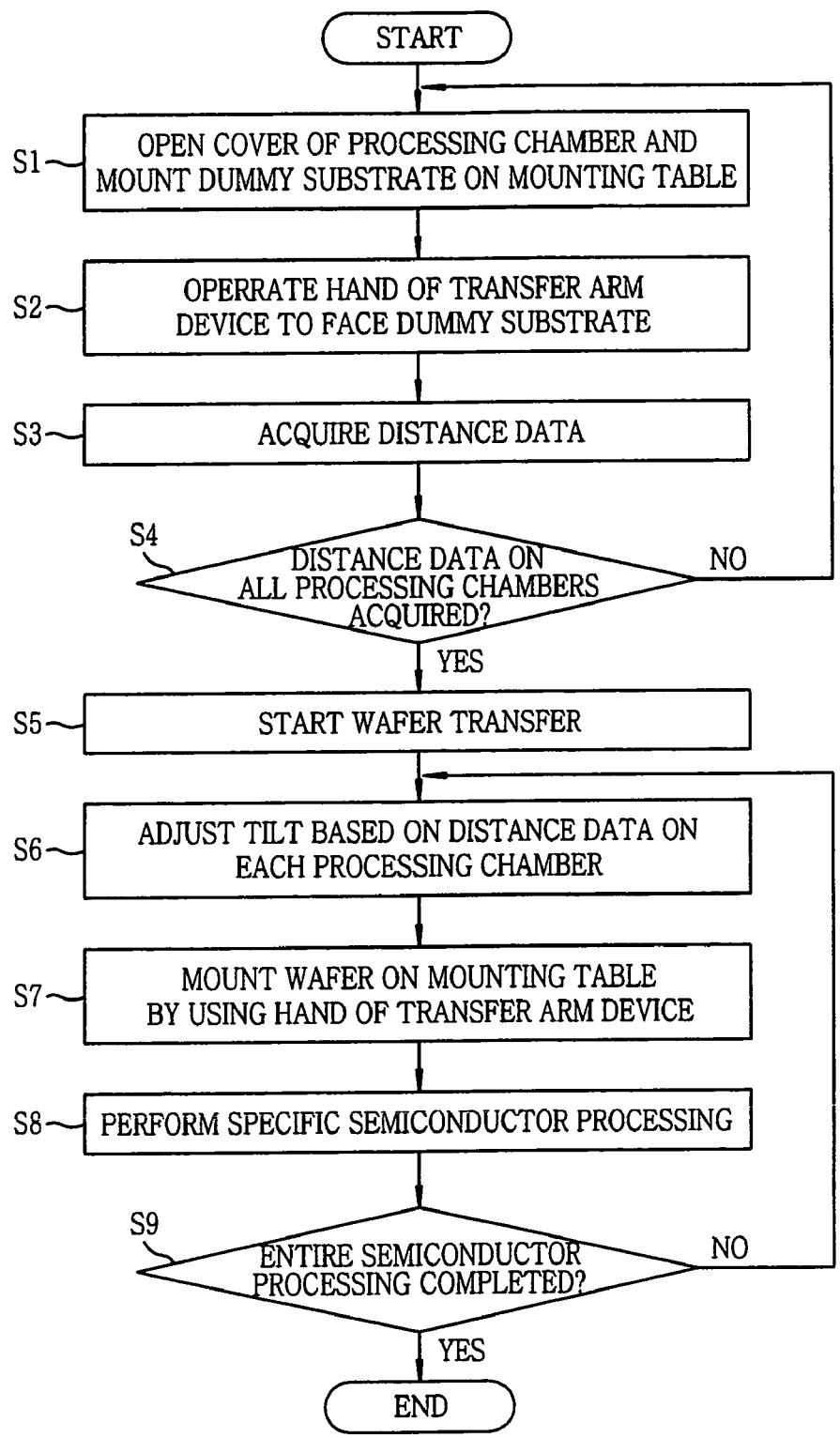
FIG. 7 is a flowchart of a process for adjusting an inclination of the transfer arm device in a mode of using sensor outputs in the equipment of FIG. 1.

FIG. 7 is a flowchart of a process for adjusting an inclination of the transfer arm device 5 in a mode using sensor outputs in the equipment of FIG. 1.

For example, during a maintenance service of the equipment or at a randomly selected specific timing, a cover of one of the process chambers 4A~4D is opened and, then, the wafer 7 is mounted on the mounting table 43, as described in step S1. Next, as shown in step S2, the transfer arm device 5 is extended until the hand 51a is positioned where it faces the surface of the dummy substrate 7 (see FIG. 5A). At this time, the wafer W is preferably kept supported on the hand 51a. Then, as described in step S3, optical sensors 71A~71C acquire distance data to the hand 51a. Thereafter, the distance data are received by the control unit 73 and then stored in the storage unit 75. The steps S1~S3 are performed on the respective process chambers 4A~4D (step S4). Accordingly, inclinations of the transfer arm device 5 with respect to each of the process chambers 4A~4D are detected.

Next, as shown in step S5, after closing the covers of the process chambers 4A~4D, the operation of the equipment and the transfer of the wafer are started. To do so, above all, the wafer W is transferred from the cassette container 20 to the transfer chamber 3. Thereafter, as shown in step S6, an inclination adjustment (tilt adjustment) of the transfer arm device 5 is performed based on the distance data for the process chamber 4A (4B, 4C, 4D) where the wafer W is transferred. In order to set a tilt, the distance data stored in the storage unit 75 are converted into the driving amount of the motors 67A~67C by the conversion unit 76 and then stored in a storage unit 77. The motors 67A~67C are controlled by reading out the driving amount.

After the tilt is adjusted, the wafer W held on the hand 51a is loaded into the corresponding process chamber 4A (4B, 4C, 4D) by extending the transfer arm device 5. Further, as depicted in step S7, the wafer W is mounted on the mounting table 43 in the process chamber 4A (4B, 4C, 4D) by a cooperation of the transfer arm device 5 and the lifter pins 46. Then, as shown in step S8, a specific semiconductor processing, e.g., an etching process, is performed.

Meanwhile, in case a different type semiconductor processing is performed on the wafer W in an additional process chamber 4B (4C, 4D), the aforementioned steps S5~S7 are executed on the corresponding process chamber 4B (4C, 4D) (step S9). The wafer W that has been subjected to the entire semiconductor processing is returned to the cassette container 20 via the load-lock chambers 24A or 24B and the transfer stage 21.

In accordance with the aforementioned embodiment, there is provided a mechanism for adjusting an inclination of the transfer arm device 5 and, specifically, an inclination of the rocking table 52 for supporting the transfer arm device 5. With such configuration, in case a scaled-up wafer W is transferred, for example, or even in case the bottom portion of the transfer chamber 3 is uneven, it is possible to transfer the wafer W while supporting the backside thereof with high horizontal stability throughout the entire access area of the transfer arm device 5. As described above, the transfer ports 33 are formed to have a narrow width of, e.g., 30 mm~50 mm. However, if transferred with such high horizontal stability, the wafer W can pass through the transfer ports 33 without collisions. Moreover, since the three lifter pins 46 are simultaneously contacted with the backside of the wafer W, the wafer W can be stably exchanged.

The timing of acquiring the distance data with the optical sensors 71A~71C is not limited to after the maintenance service of the equipment is completed. For example, the aforementioned distance data can also be obtained when the transfer arm device 5 is instructed to perform a transfer operation during an operation of the equipment or the like. In this case as well, the same effects of the aforementioned case can be achieved.

The aforementioned tilt adjusting mechanism can perform the adjustment with respect to the imaginary reference surface IRF, together with the height adjusting mechanism (Z-axis adjusting mechanism) for adjusting the height of the transfer arm device 5. As for the Z-axis adjusting mechanism, there can be employed a configuration in which the drive mechanism 55 has a function of vertically moving the transfer arm device 5. In this case as well, the same effects of the aforementioned case can be achieved.

The optical sensors 71A~71C can be provided on the backside of the dummy substrate instead of the top surface thereof. In this case, in order to measure the distance, the transfer arm device 5 is extended to a position facing the surface of the mounting table 43 while supporting the dummy substrate. After that, the optical sensors 71A~71C provided on the backside of the dummy substrate measure the distances to the surface of the mounting table 43. Accordingly, it is possible to achieve the same effects of the aforementioned case.

Figure 8:
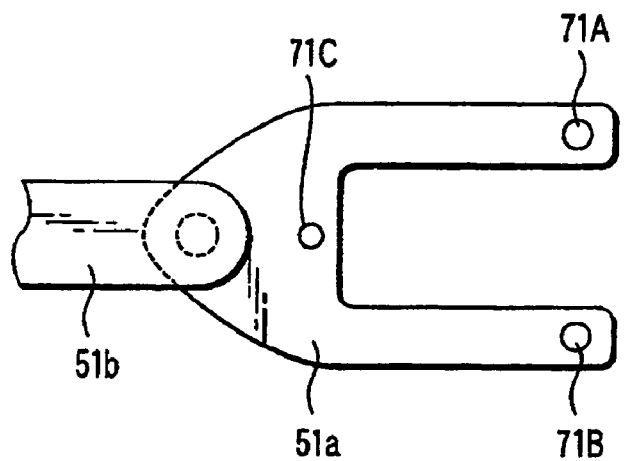
FIG. 8 shows a bottom view of a modified example of the transfer arm device of the equipment of FIG. 1.

FIG. 8 shows a bottom view of a modified example of the transfer arm device of the equipment of FIG. 1. In the modified example shown in FIG. 8, the optical sensors 71A~71C are provided on the backside of the hand 51a of the transfer arm device 5. In this case, in order to measure the distance, the transfer arm device 5 is extended to a position facing the surface of the mounting table 43. After that, the optical sensors 71A~71C provided on the backside of the hand 51a measure respective distances to the surface of the mounting table 43. Accordingly, the same effects of the aforementioned case can be achieved.

Figure 9:
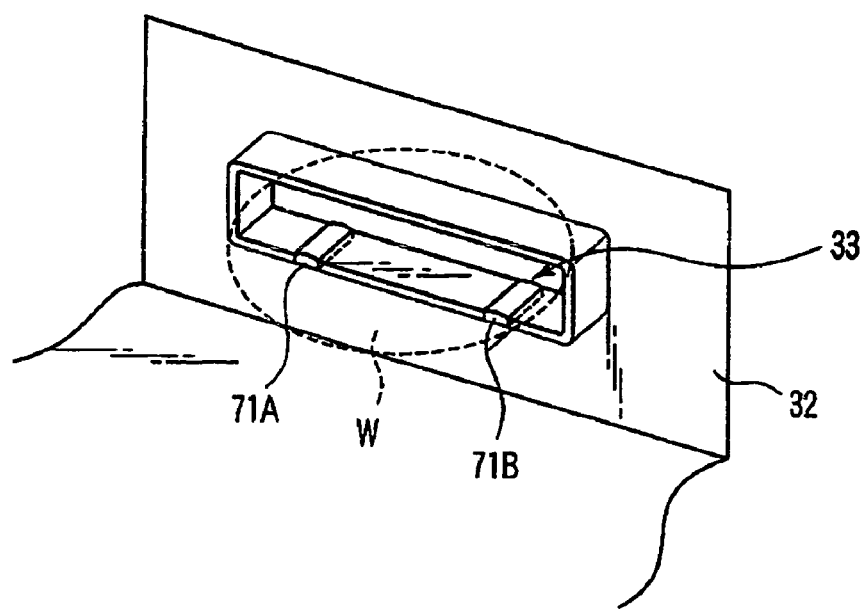
FIG. 9 describes a perspective view of a modified example of the transfer port of the equipment of FIG. 1.

FIG. 9 describes a perspective view of a modified example of the transfer port of the equipment of FIG. 1. In the modified example shown in FIG. 9, the optical sensors 71A and 71B are provided on bottom surface of the transfer port 33 of each process chamber 4A (4B, 4C, 4D). In this case, in order to measure the distance, the transfer arm device 5, e.g., supporting the wafer W, is extended to a position facing the optical sensors 71A and 71B. After that, the optical sensors 71A and 71B, which are provided on the bottom surface of the transfer port 33, measure respective distances to the backside of the wafer W. Hence, the same effects of the aforementioned case can be achieved. Moreover, if the distance data from the corresponding port 33 as well as those from the aforementioned mounting table 43 are allowed to be acquired, a more accurate control can be realized.

In case an optical sensor is provided at the transfer port 33 or the hand 51a, the optical sensor is exposed to a processing gas. Therefore, in this case, it is preferable to install a device, e.g., a heater, for heating a light receiving unit of the corresponding optical sensor. Consequently, it is possible to prevent a byproduct film generated by the processing gas from being deposited to the light receiving unit, thereby enabling to obtain stable distance data.

The distance can be measured not only by using the optical sensors 71A~71C but also by using a CCD camera, for example. In this case, the distance is detected based on image data captured by the CCD camera. Accordingly, the same effects of the aforementioned case can be achieved.

Figure 10:
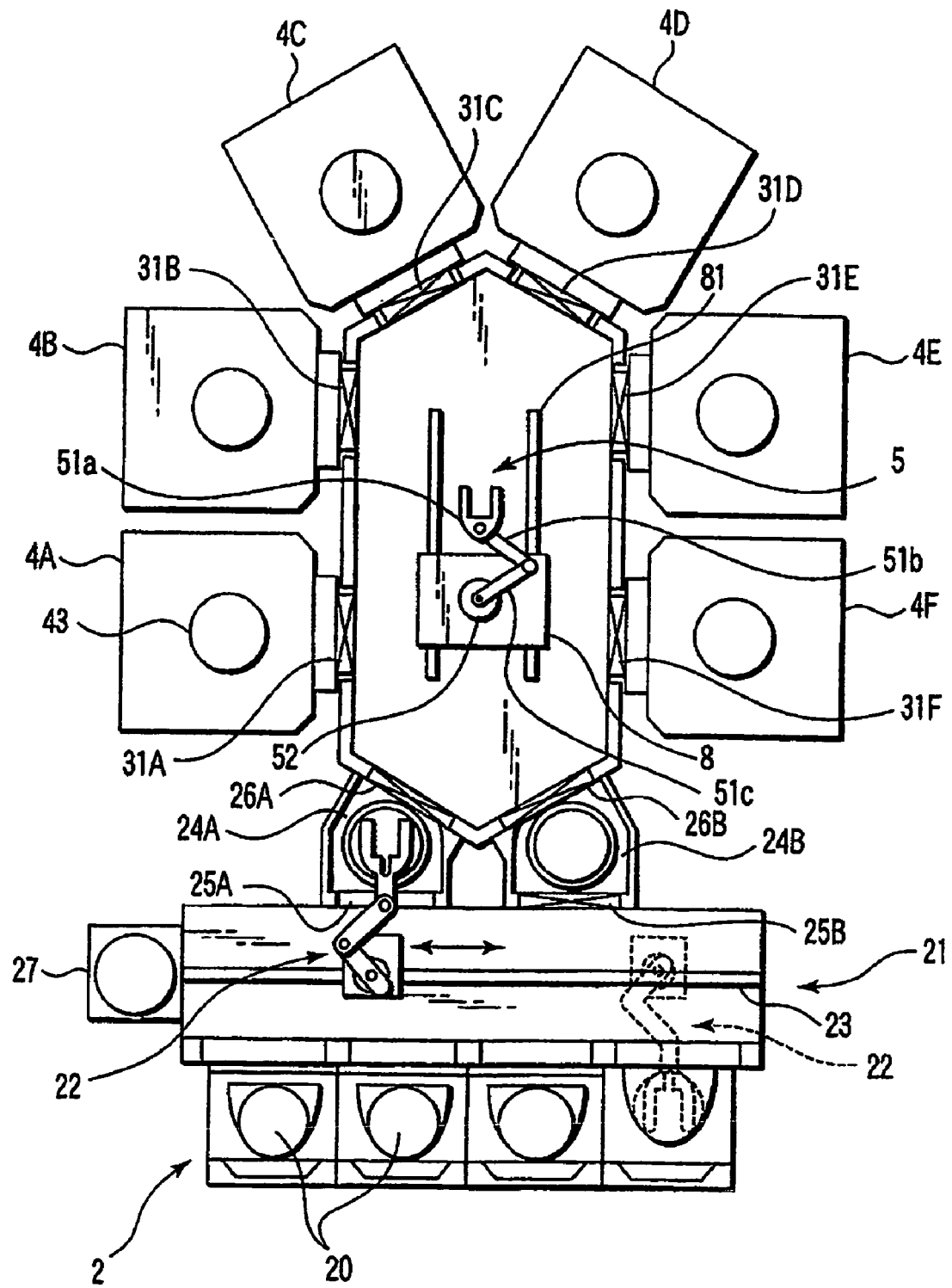
FIG. 10 provides a schematic top view of a semiconductor processing equipment in accordance with another preferred embodiment of the present invention.
Figure 11:
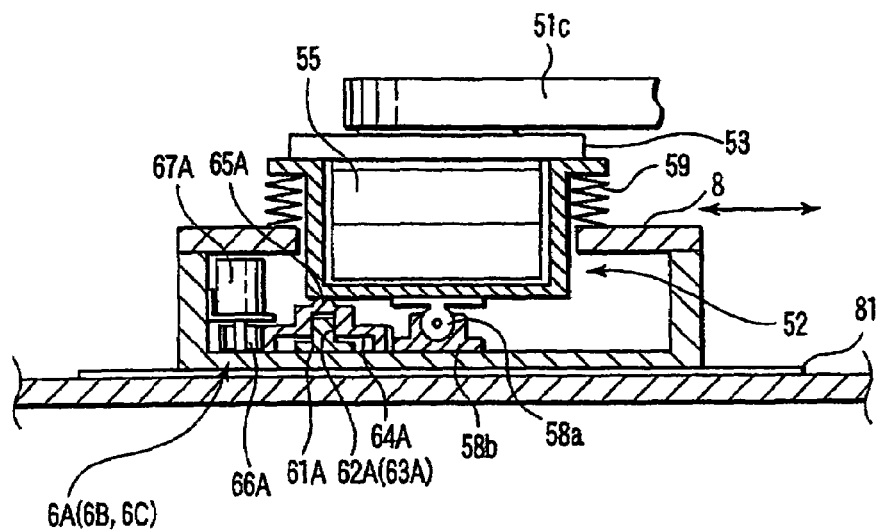
FIG. 11 presents a sectional view of a rocking table for supporting a transfer arm device disposed in a vacuum transfer chamber of the equipment of FIG. 10.
Figure 12:
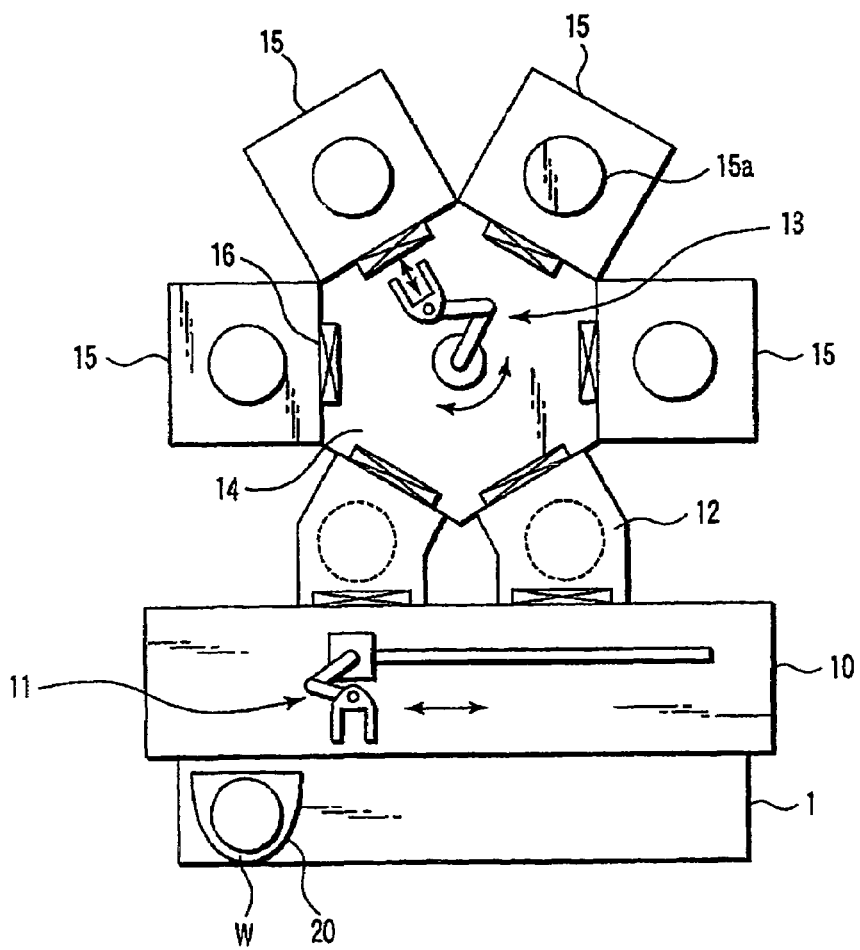
FIG. 12 offers a schematic top view of a conventional multi-chamber type semiconductor processing equipment.

FIG. 10 provides a schematic top view of a semiconductor processing equipment in accordance with another preferred embodiment of the present invention. FIG. 11 presents a sectional view of a rocking table for supporting a transfer arm device disposed in a vacuum transfer chamber of the equipment of FIG. 10. The equipment shown in FIG. 10 has the same configuration as that of the equipment of FIG. 1 except that the transfer arm device 5 accesses six process chambers 4A~4F connected with the transfer chamber 3 in a sliding movement.

In order to allow the transfer arm device 5 to move in a sliding motion, as shown in FIG. 11, a box-shaped moving body 8 corresponding to the cover 57 shown in FIG. 4 is disposed on the bottom portion of the transfer chamber 3 with a gap therebetween. The moving body 8 supports the rocking table 52 from underside and has therein the adjusters 6A~6C. Further, the moving body 8 is supported such that it can travel along a guide rail 81 formed on the bottom portion of the transfer chamber 3. Moreover, the moving body 8 moves along the guide rail 81 as a unit with the transfer arm device 5 by a driving unit (not shown) for a sliding movement.

For instance, in case the wafer W is loaded into the process chambers 4B~4E provided at the rear portion, first of all, the wafer W is unloaded from the load-lock chamber 24A or 24B. Next, the moving body 8 moves in a sliding motion toward the rear portion until it reaches a specific position. Thereafter, the wafer W is loaded into one of the process chambers 4B~4E by extending the transfer arm device 5. With such configuration, the same effects of the aforementioned case can be achieved. Especially, in this case, the transfer arm device 5 can be easily deformed because a load caused by the vacuum state becomes heavy due to a scaling up of the transfer chamber 3. Therefore, the tilt adjustment of the transfer arm device 5 will be effective.

The adjuster 6A (6B, 6C) is not limited to the aforementioned configuration in which they are raised and lowered by using the guide 61A (61B, 61C) and the first gear 64A (64B, 64C) together. As for the adjuster 6A (6B, 6C), there can be used other devices such as a linear actuator, a parallel link or the like. With such configuration, the same effects of the aforementioned case can be achieved.

The tilt adjustment is performed not only before the transfer arm device 5 supporting the wafer W is loaded into the process chamber 4A (4B, 4C, 4D). For example, the tilt adjustment can be carried out twice, i.e., before the transfer arm device 5 is loaded into the process chamber 4A (4B, 4C, 4D) and after the transfer arm device 5 is loaded into the process chamber 4A (4B, 4C, 4D) but before the wafer W is delivered onto the lifter pins 46. In this case, as described above, it is possible to use the distance data from the transfer port 33 as well as those from the mounting table 43. Further, the tilt adjustment can be performed only after the transfer arm device 5 is loaded into the process chamber 4A (4B, 4C, 4D), which is effective in case of using the transfer port 33 having a scaled-up size depending on types of processes assigned to the process chamber 4A (4B, 4C, 4D).

The transfer arm device 5 can be supported on a ceiling portion or a sidewall of the transfer chamber 3 instead of the bottom portion thereof. In this case as well, the same effect of the aforementioned case can be obtained.

The tilt can be adjusted to reduce an acceleration generated by starting or stopping operations of extending, turning or sliding the transfer arm device 5. Accordingly, when the operations are started or stopped, the wafer W can be prevented from sliding on the hand 51a, thereby enabling to suppress a misalignment of the wafer W. As a result, the wafer W can be more stably exchanged and, also, the throughput can be improved by increasing a transfer speed.

While the invention has been shown and described with respect to the preferred embodiments, it will be understood by those skilled in the art that various changes and modification may be made without departing from the scope of the invention as defined in the following claims.

What is claimed is:

1. A semiconductor processing equipment comprising:
   a transfer chamber having a plurality of transfer ports disposed at different positions in a lateral direction;
   a process chamber connected to the transfer chamber via one of the plurality transfer ports which performs a semiconductor processing on a substrate to be processed;
   a transfer arm device arranged in the transfer chamber which transfers the substrate to be processed via the plurality of transfer ports;
   a drive mechanism which extends and retracts the transfer arm device and turns the transfer arm device around a vertical axis direction;
   an inclination adjusting mechanism which adjusts an inclination of the transfer arm device; and
   a rocking table rockable with respect to the transfer chamber which supports the transfer arm device,
   wherein the inclination adjusting mechanism adjusts an inclination of the transfer arm device by adjusting an inclination of the rocking table.

2. The equipment of claim 1, wherein the drive mechanism is provided on the rocking table.

3. The equipment of claim 1, wherein the inclination adjusting mechanism has a plurality of adjusters which separately raise and lower at least three locations disposed along a circumference of the rocking table.

4. The equipment of claim 1, wherein the transfer chamber is a vacuum transfer chamber; the plurality of transfer ports are connected with a plurality of vacuum process chambers via respective gate valves; and
   the process chamber is one of the plurality of vacuum process chambers.

5. The equipment of claim 1, further comprising a detector which detects data on an inclination of the transfer arm device.

6. The equipment of claim 3, further comprising a control unit which drives the adjusters based on data on the inclination of the transfer arm device.

7. The equipment of claim 3, wherein the rocking table is supported at a single location of the bottom portion by a universal joint.

8. The equipment of claim 7, further comprising a pliable wall formed between the rocking table and a wall of the transfer chamber which separates a space where the plurality of adjusters and the universal joint are arranged from an inner space of the transfer chamber and also which allows an operation of the rocking table.

9. The equipment of claim 5, further comprising a storage unit which stores the data detected by the detector and a control unit which controls the inclination adjusting mechanism based on the data stored in the storage unit.

10. The equipment of claim 5, wherein the detector has a plurality of optical sensors spaced from each other in a lateral direction, each which measures a distance to a facing portion thereof.

11. The equipment of claim 10, wherein the transfer arm device has a hand and the plurality of optical sensors is disposed on a bottom surface of the transfer arm device hand.

12. The equipment of claim 10, wherein the plurality of optical sensors is provided at the transfer ports connected to the process chambers.

13. The equipment of claim 10, wherein the plurality of optical sensors are arranged on a dummy substrate serving as a substitute for the substrate to be processed.

14. The equipment of claim 10, wherein each of the plurality of optical sensors has a light emitting unit which emits light to the facing portion thereof and a light receiving unit which receives light reflected from the facing portion thereof.

15. A semiconductor processing method using semiconductor processing equipment comprising a transfer chamber having a plurality of transfer ports disposed at different positions in a lateral direction, a process chamber connected to the transfer chamber via one of the plurality transfer ports which performs a semiconductor processing on a substrate to be processed, a transfer arm device arranged in the transfer chamber which transfers the substrate to be processed via the plurality of transfer ports, a drive mechanism which extends and retracts the transfer arm device and turns the transfer arm device around a vertical axis direction, an inclination adjusting mechanism which adjusts an inclination of the transfer arm device and a rocking table rockable with respect to the transfer chamber which supports the transfer arm device, wherein the inclination adjusting mechanism adjusts an inclination of the transfer arm device by adjusting an inclination of the rocking table, the method comprising the steps of:
   detecting data on an inclination of the transfer arm device by using a detector;
   adjusting an inclination of the transfer arm device based on the data by using the inclination adjusting mechanism;
   loading the substrate to be processed into the process chamber by using the transfer arm device having the adjusted inclination; and
   performing a semiconductor processing on the substrate to be processed in the process chamber.

16. The method of claim 15, wherein the detector has a plurality of optical sensors spaced from each other in a lateral direction, each which measures a distance to a facing portion thereof, and wherein the method further comprises the step of calculating a location of the substrate to be processed supported by the transfer arm device with respect to an imaginary reference surface based on the distance data obtained by the plurality of optical sensors.

17. The method of claim 15, wherein the detector has a plurality of optical sensors spaced from each other in a lateral direction, each which measures a distance to a facing portion thereof and the plurality of optical sensors are arranged on the dummy substrate serving as a substitute for the substrate to be processed, and wherein the method further comprises, before the step of detecting data on the inclination, the step of arranging the dummy substrate on a specific mounting table and also arranging the transfer arm device at a position corresponding to the plurality of optical sensors above the dummy substrate.

18. The method of claim 15, wherein the plurality of transfer ports are connected with a plurality of process chambers, and wherein the step of detecting data on the inclination and the step of adjusting an inclination of the transfer arm device are performed on each of the plurality of process chambers.

19. The method of claim 17, wherein the specific mounting table is a mounting table disposed in the process chamber and which mounts thereon the substrate to be processed in performing the semiconductor processing.

* * * * *